(12) United States Patent
Hui et al.

(10) Patent No.: US 8,564,041 B2
(45) Date of Patent: Oct. 22, 2013

(54) CONTACTS FOR SEMICONDUCTOR DEVICES

(75) Inventors: Angela T. Hui, Fremont, CA (US); Wenmei Li, Sunnyvale, CA (US); Minh Van Ngo, Fremont, CA (US); Amol Ramesh Joshi, Sunnyvale, CA (US); Kuo-Tung Chang, Saratoga, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 158 days.

(21) Appl. No.: 11/551,532

(22) Filed: Oct. 20, 2006

(65) Prior Publication Data

US 2008/0096348 A1    Apr. 24, 2008

(51) Int. Cl.
*H01L 27/108* (2006.01)
(52) U.S. Cl.
USPC .......................... 257/314; 257/315; 257/316
(58) Field of Classification Search
USPC .................................. 257/314–316, E27.103
See application file for complete search history.

(56) References Cited

U.S. PATENT DOCUMENTS

| | | | | |
|---|---|---|---|---|
| 5,357,132 A * | 10/1994 | Turner | | 257/305 |
| 5,953,614 A * | 9/1999 | Liu et al. | | 438/303 |
| 6,037,223 A * | 3/2000 | Su et al. | | 438/257 |
| 6,255,205 B1 * | 7/2001 | Sung | | 438/595 |
| 6,420,104 B1 | 7/2002 | Rangarajan et al. | | |
| 6,855,599 B2 * | 2/2005 | Hung et al. | | 438/257 |
| 2005/0009272 A1 * | 1/2005 | Chen et al. | | 438/257 |
| 2005/0035455 A1 * | 2/2005 | Hu et al. | | 257/758 |
| 2005/0140002 A1 * | 6/2005 | Shin et al. | | 257/734 |
| 2005/0158948 A1 * | 7/2005 | Kim et al. | | 438/253 |
| 2005/0195636 A1 * | 9/2005 | Umezawa et al. | | 365/149 |
| 2006/0003530 A1 * | 1/2006 | Kim et al. | | 438/258 |
| 2006/0091549 A1 * | 5/2006 | Kojima | | 257/758 |
| 2006/0163642 A1 * | 7/2006 | Widdershoven et al. | | 257/315 |
| 2006/0234446 A1 * | 10/2006 | Wei et al. | | 438/257 |

* cited by examiner

*Primary Examiner* — Tran Tran
(74) *Attorney, Agent, or Firm* — Harrity & Harrity, LLP

(57) ABSTRACT

A memory device includes a number of memory cells and a dielectric layer formed over the memory cells. The memory device also includes contacts formed in the dielectric layer and spacers formed adjacent the side surfaces of the contacts. The spacers may inhibit leakage currents from the contacts.

20 Claims, 13 Drawing Sheets

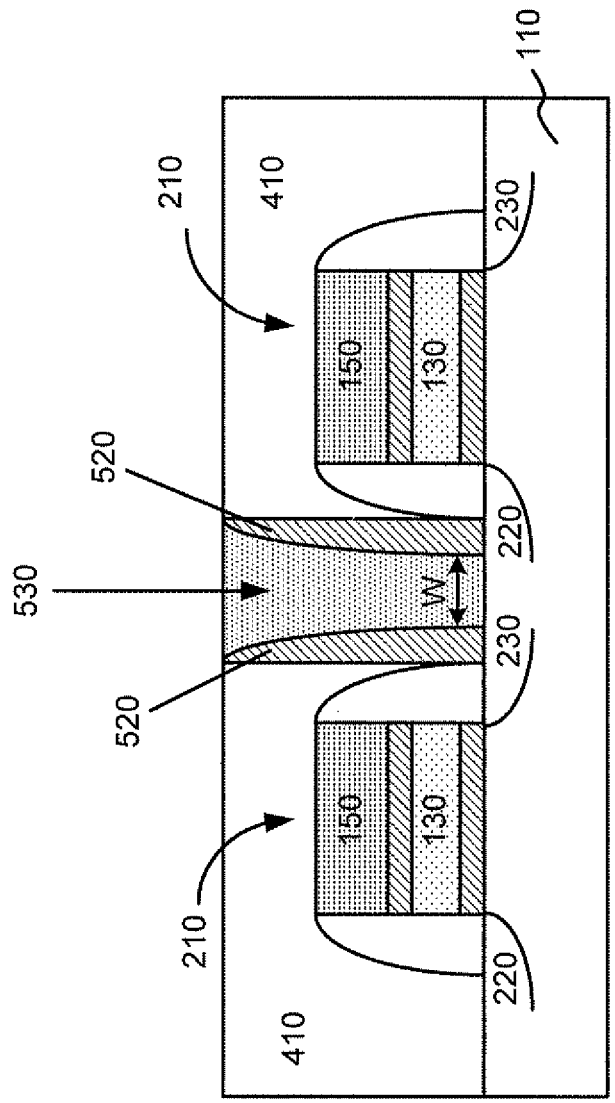

US 8,564,041 B2

CONTACTS FOR SEMICONDUCTOR DEVICES

TECHNICAL FIELD

The invention relates generally to semiconductor devices and methods of manufacturing semiconductor devices. The invention has particular applicability to memory devices and the formation of contacts for memory devices.

BACKGROUND ART

The escalating demands for high density and performance associated with non-volatile memory devices, such as electrically erasable programmable read only memory (EEPROM) devices, require small design features, high reliability and increased manufacturing throughput. The reduction of design features, however, challenges the limitations of conventional methodology.

One particular problem with non-volatile memory devices involves charge leakage from contacts. For example, as device dimensions become smaller and chip sizes decrease, charge leakage from a contact to the charge storage element of a memory cell may occur. The charge leakage may occur when electrons travel laterally from the contact through a dielectric layer into the charge storage element or vice versa. Charge leakage currents may make it difficult for the memory device to be efficiently programmed or erased. In addition, the charge leakage may also make it difficult for the memory device to meet the expected data retention requirements and, ultimately, may lead to device failure.

DISCLOSURE OF THE INVENTION

Advantages and features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a memory device is provided. The memory device includes a substrate, a first dielectric layer formed over the substrate, a charge storage element formed over the first dielectric layer, a second dielectric layer formed over the charge storage element and a control gate formed over the second dielectric layer. The memory device also includes an interlayer dielectric layer formed over the control gate, a source region formed in the substrate and a drain region formed in the substrate. The memory device further includes a contact formed in a portion of the interlayer dielectric, the contact having a width ranging from about 400 angstroms (Å) to about 900 Å.

According to another aspect consistent with the invention, a non-volatile memory device that includes a plurality of memory cells is provided. Each of the memory cells includes a first dielectric layer formed on a substrate, a charge storage element formed on the first dielectric layer, an inter-gate dielectric formed on the charge storage element, a control gate formed over the inter-gate dielectric, a source region formed in the substrate and a drain region formed in the substrate. The non-volatile memory device also includes a second dielectric layer formed over the plurality of memory cell and a contact formed in a portion of the second dielectric layer. The contact has a width of less than 1200 Å.

According to a further aspect consistent with the invention, a memory device is provided. The memory device includes a plurality of memory cells and a dielectric layer formed over the plurality of memory cells. The memory device also includes a plurality of contacts formed in the dielectric layer. Each of the plurality of contacts has a width of less than 1400 Å and is formed adjacent at least one of a source region or a drain region of one of the plurality of memory cells.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 5A-5C are cross-sections illustrating the formation of an exemplary contact in the interlayer dielectric of FIG. 4.

BEST MODE FOR CARRYING OUT THE INVENTION

Figure 1:
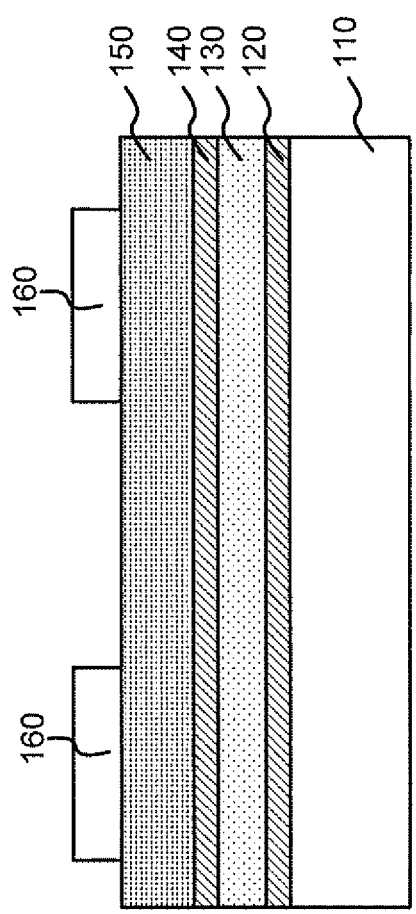
FIG. 1 is a cross-section illustrating exemplary layers used to form memory cells in an exemplary embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), and may have a thickness ranging from, for example, about 30 angstroms (Å) to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride) or an oxynitride. Layer 130, consistent with the invention, may act as a charge storage layer for semiconductor device 100 and may have a thickness ranging from, for example, about 40 Å to about 100 Å. In alternative implementations, layer 130 may include a conductive material, such as polycrystalline silicon, used to form a floating gate electrode. In this implementation, layer 130 may have a thickness ranging from about 500 Å to about 1,000 Å.

Layer 140 may be formed on layer 130 in a conventional manner and may include a dielectric material, such as an oxide (e.g., $SiO_2$). Alternatively, layer 140 may include another material having a high dielectric constant (K), such as aluminum oxide or hafnium oxide, that may be deposited or thermally grown on layer 130. In still other alternatives, layer 140 may be a composite that includes a number of dielectric layers or films. Layer 140 may have a thickness ranging from, for example, about 40 Å to about 100 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from, for example, about 1,000 Å to about 2,000 Å.

A photoresist material may be patterned and etched to form masks 160 on the top surface of layer 150, as illustrated in FIG. 1. Masks 160 may be used to facilitate formation of one or more memory cells in semiconductor device 100, as described in more detail below.

Figure 2:
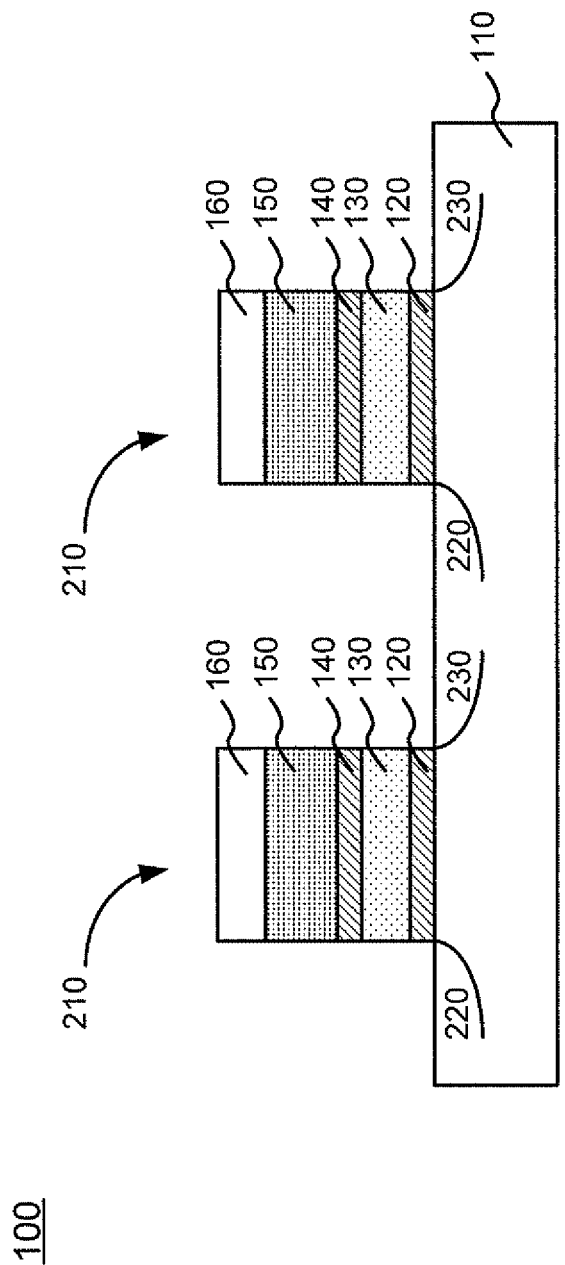
FIG. 2 is a cross-section illustrating the formation of exemplary memory cells in accordance with an exemplary embodiment of the invention.

Semiconductor device 100 may then be etched, as illustrated in FIG. 2. Referring to FIG. 2, layers 120-150 may be etched in a conventional manner with the etching terminating at substrate 110, thereby forming structures 210. Alternatively, the etching may terminate at an other layer, such as layer 140, followed in some implementations by additional etching, to form structures 210. Each structure 210 (also referred to herein as a memory cell 210) may represent a memory cell of semiconductor device 100, where each memory cell 210 includes a dielectric layer 120, a charge storage layer 130, an inter-gate dielectric layer 140 and a control gate electrode 150. Only two memory cells 210 are illustrated in semiconductor device 100 in FIG. 2 for simplicity. It should be understood that semiconductor device 100 may typically include a memory array including a large number of memory cells 210.

In an exemplary implementation consistent with the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110. In alternative implementations, each memory cell 210 may be a floating gate memory cell, with a silicon control gate electrode 150, an inter-gate dielectric 140, a polysilicon floating gate electrode 130 and a tunnel oxide layer 120 formed on substrate 110.

Source and drain regions 220 and 230 may then be formed in substrate 110, as illustrated in FIG. 2. For example, n-type or p-type impurities may be implanted in substrate 110 to form source and drain regions 220 and 230, based on the particular end device requirements. In one implementation, an n-type dopant, such as phosphorous or arsenic, may be implanted. Alternatively, a p-type dopant, such as boron, may be implanted. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
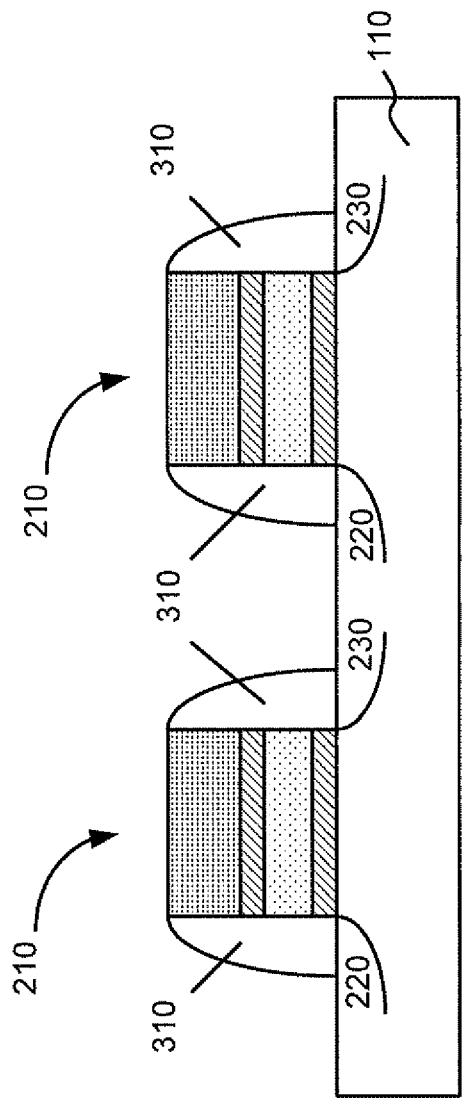
FIG. 3 is a cross-section illustrating the formation of spacers adjacent the side surfaces of the memory cells of FIG. 2.

Photoresist masks 160 may be removed using a conventional process. Spacers 310 may be formed adjacent the sidewalls of the memory cells 210, as illustrated in FIG. 3. For example, a dielectric material, such as a silicon oxide, a silicon nitride, a silicon oxynitride or another dielectric material, may be deposited and etched to form spacers 310 on each side of memory cells 210, as illustrated in FIG. 3. Spacers 310 may be used to electrically isolate adjacent memory cells 210 from each other. Spacers 310 may also be used to facilitate the deposition of impurities in semiconductor device 100.

A metal may optionally be deposited over semiconductor device 100, followed by an annealing to form a metal-silicide compound. For example, a metal, such as cobalt, titanium or nickel, may be deposited over the surface of semiconductor device 100. An annealing procedure may be performed to form a metal-silicide layer (not shown) over the surface of control gate electrodes 150. The metal-silicide may also be formed over the portion of source/drain regions 220 and 230 not covered by spacers 310. Unreacted metal may be removed from spacers 310.

Figure 4A:
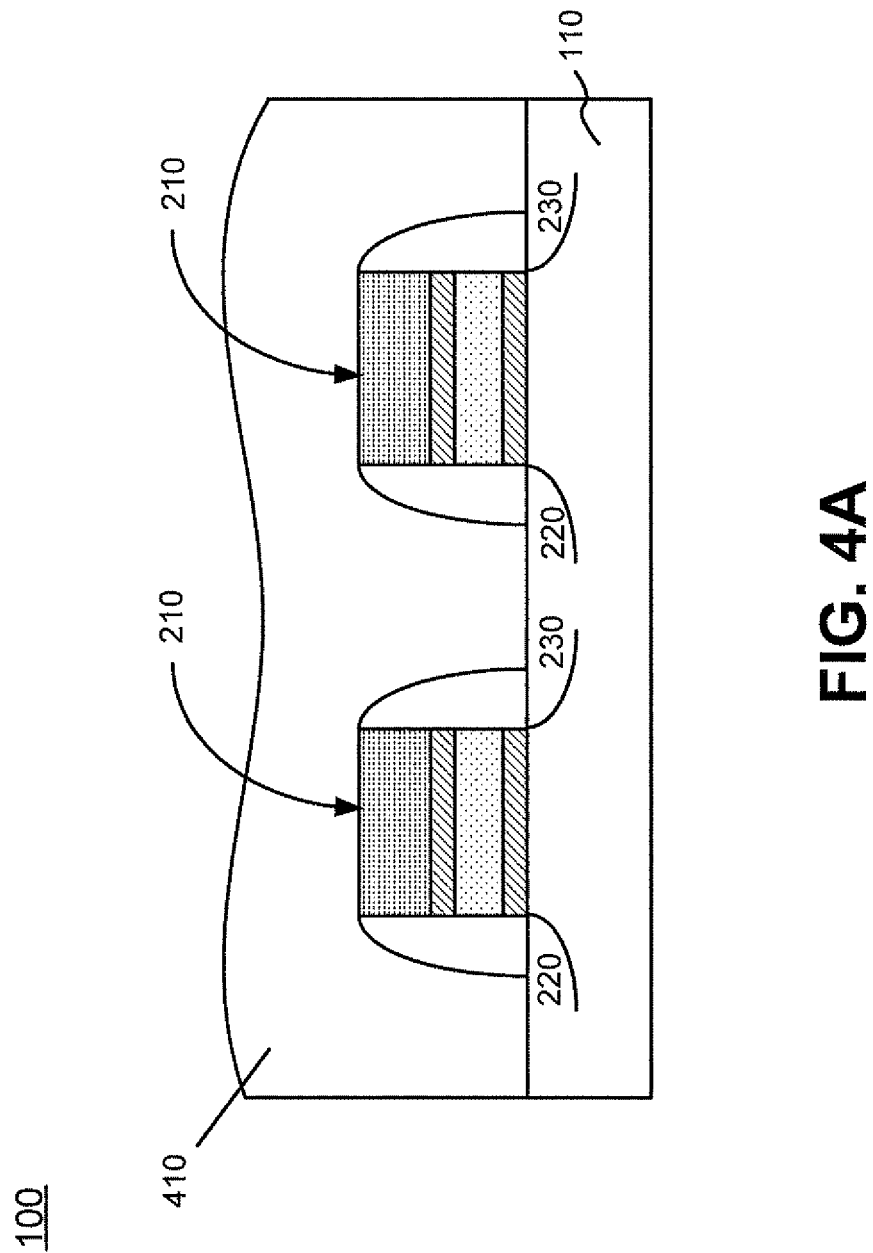
FIGS. 4A and 4B are cross-sections illustrating the formation of an interlayer dielectric on the device of FIG. 3.

A dielectric layer 410 may then be deposited over semiconductor device 100, as illustrated in FIG. 4A. Dielectric layer 410, also referred to as interlayer dielectric (ILD) 410, may include, for example, an oxide (e.g., $SiO_2$), a borophosphosilicate glass (BPSG) material or a phosphosilicate glass (PSG) material. Dielectric layer 410 may have a thickness ranging from about 6,000 Å to about 10,000 Å.

Figure 4B:
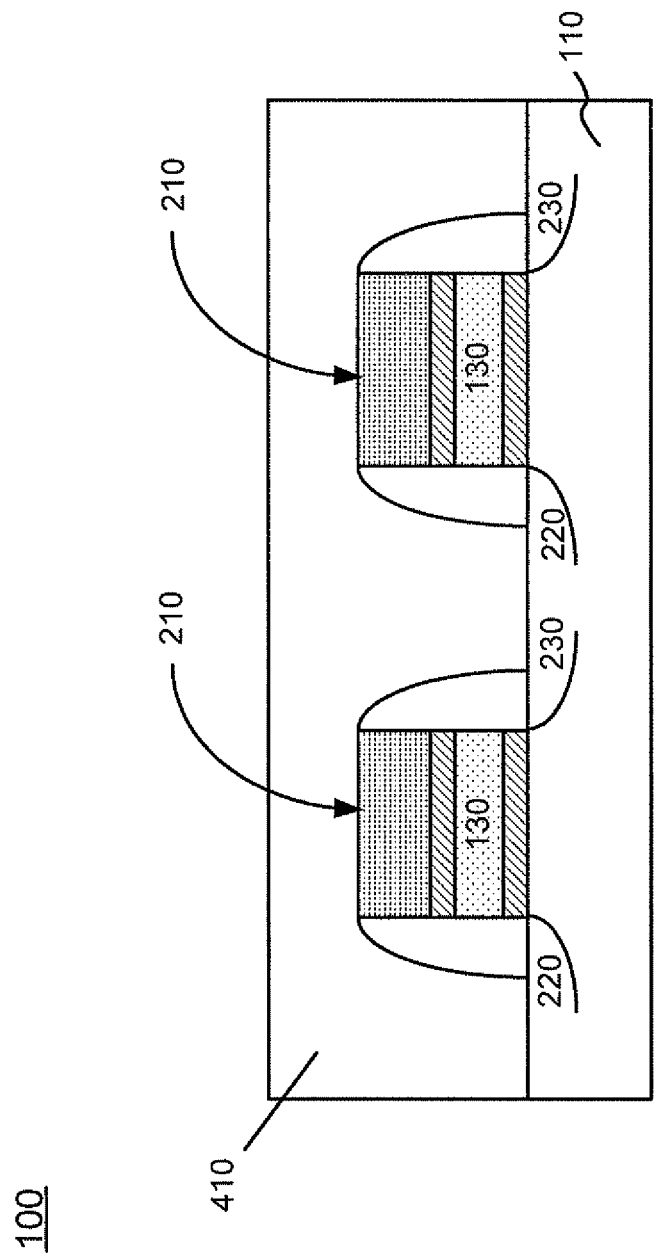

ILD 410 may optionally be planarized using a conventional process, such as a chemical-mechanical polishing (CMP) process, as illustrated in FIG. 4B. Referring to FIG. 4B, the CMP process may planarize the top surface of ILD 410 to facilitate formation of subsequent structures, such as interconnect lines. ILD 410, consistent with the invention, may represent an ILD located closest to substrate 110. In alternative implementations, ILD 410 may represent an interlayer dielectric formed a number of layers above the surface of substrate 110. In each case, ILD 410 functions to isolate various conductive structures, such as various interconnect lines described below or to isolate source region 220 or drain region 230 from other conductive structures.

Figure 5A:
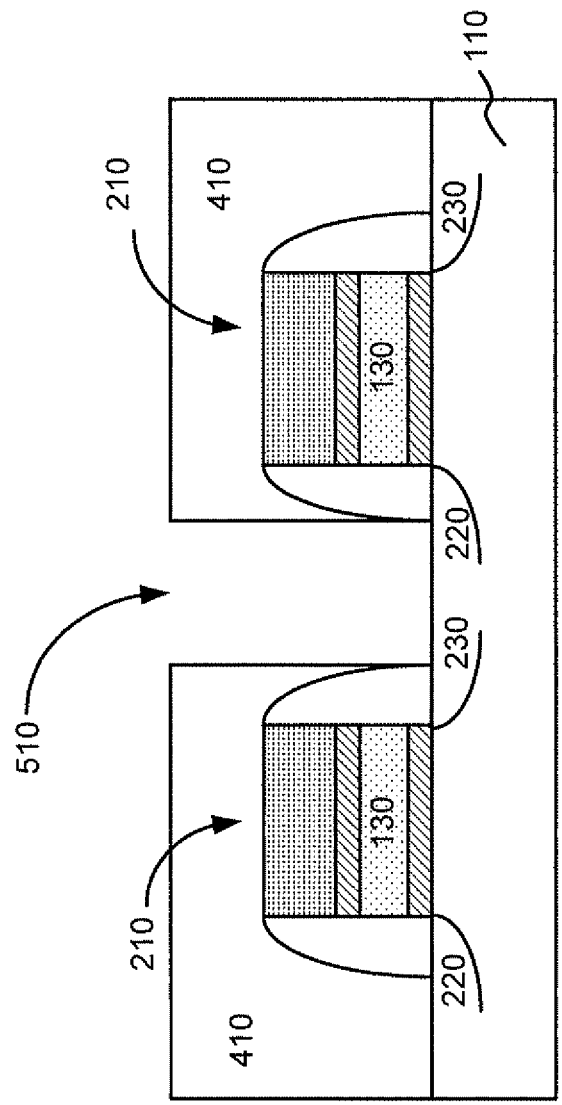

A trench 510, also referred to as contact hole 510, may be formed in ILD 410 using conventional photolithographic and etching techniques, as illustrated in FIG. 5A. Contact hole 510 may be used to form a contact to a source region 220 and/or a drain region 230 of memory cells 210. In an exemplary implementation, the width of contact hole 510 may range from about 0.1 micrometers (μm) to about 0.3 μm.

Figure 5B:
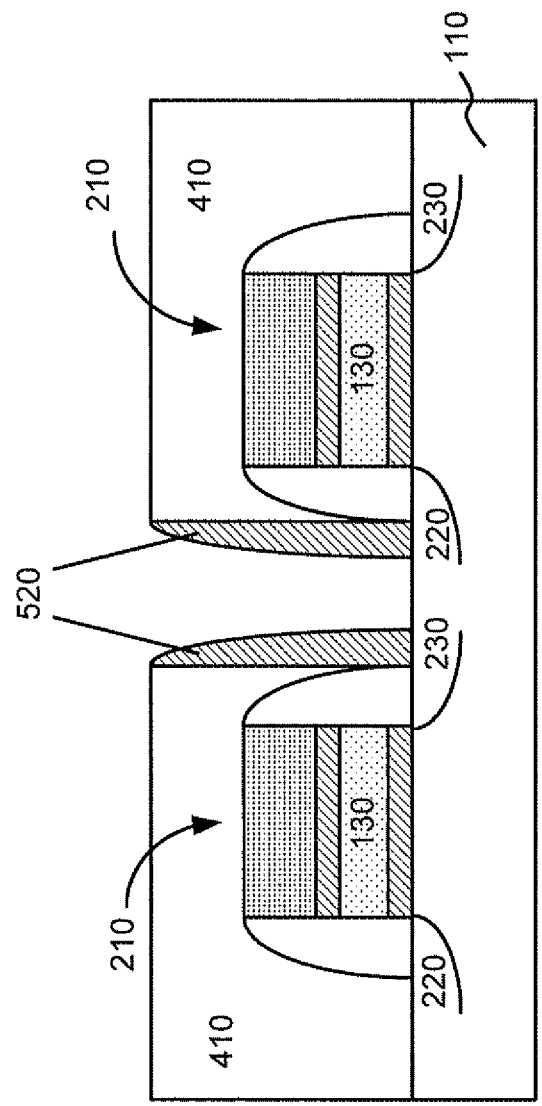

A dielectric material, such as, for example, a silicon nitride, a silicon oxynitride, or another nitride-based dielectric material, may then be deposited and etched to form spacers 520 on the side surfaces of contact hole 510, as illustrated in FIG. 5B. Alternatively, other dielectric materials, such as a silicon oxide, may be used to form spacers 520. In an exemplary implementation, the width of each of spacers 520 may range from about 50 Å to about 400 Å. In addition, in an exemplary implementation, the height of spacers 520 may range from about 4,000 Å to about 8,000 Å.

Next, a metal layer, such as, for example, tungsten, copper or aluminum, may be deposited to fill contact hole 510 to form contact 530, as illustrated in FIG. 5C. Contact 530 may represent a contact to, for example, the drain region 230 of one memory cell 210 (e.g., the memory cell 210 located on the left side of FIG. 5C) and to the source region 220 of an adjacent memory cell 210 (e.g., the memory cell 210 located on the right side of FIG. 5C). The drain region 230 of the left memory cell 210 in FIG. 5C and the source region 220 of the adjacent memory cell 210 in FIG. 5C may be coupled together to form a bit line. The bit line may be coupled to a column of memory cells 210 (not shown) in a memory cell array. Contact 530 may be used to apply programming and/or erasing voltages to the bit line associated with a column of memory cells 210 based on the particular circuit requirements. Although only one contact 530 is illustrated in FIG. 5C, it should be understood that memory device 100 may include a large number of contacts 530 that may be used to apply voltages to bit lines and/or word lines in memory device 100.

In an exemplary implementation, the width of contact 530 at the lower portion of contact 530, illustrated as W in FIG. 5C, may range from about 900 Å to about 2,200 Å. In another exemplary implementation, the width of contact 530 (i.e., width W in FIG. 5C) may be less than 900 Å. For example, the width W of contact 530 may range from about 400 Å to about 900 Å. In each case, spacers 520 allow narrow contacts (e.g., contact 530) to be formed, while also preventing charge leakage from contact 530 to memory cells 210 and vice versa. For example, spacers 520 provide a dielectric barrier that inhibits contact leakage from contact 530 to charge storage layer 130 and/or to control gate electrode 150 of memory cells 210 and vice versa. Spacers 520 also help improve data retention of memory cells 210 by inhibiting charge gain and/or charge loss caused by electrons traveling from contact 530 into charge storage layer 130 and vice versa. This enables memory cells 210 to be efficiently programmed and/or erased without adverse effects associated with contact leakage currents. In addition, the use of spacers 520 allow contacts 530 to be formed in closer proximity to memory cells 210 than in conventional memory devices, thereby reducing space requirements associated with forming a large array of memory cells.

Figure 6:
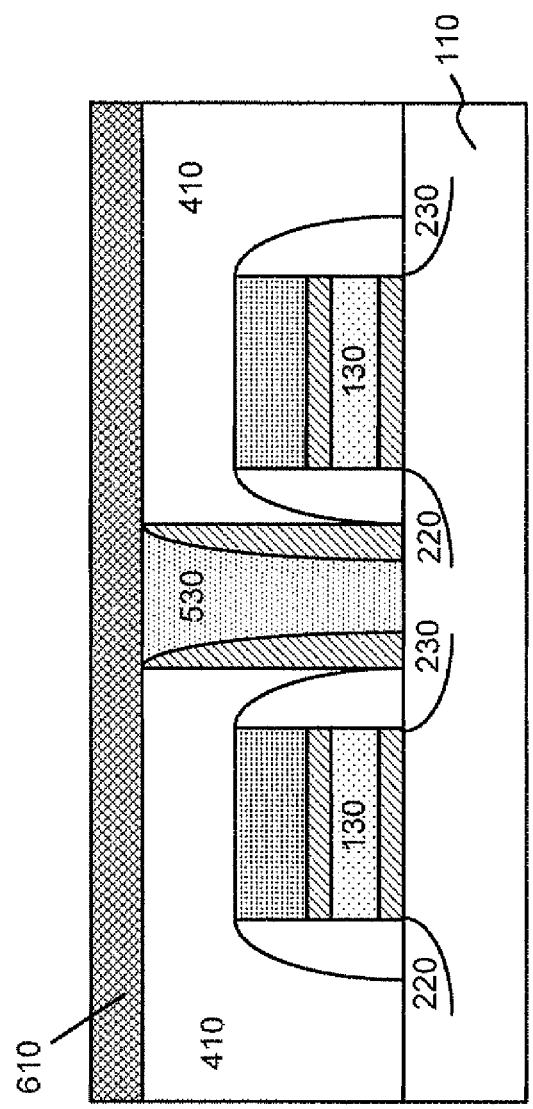
FIG. 6 is a cross-section illustrating the formation of conductive layer on the device of FIG. 5C.

Excess portions of the metal used to form contact 530 that may be formed over portions of dielectric layer 410 may be removed in some implementations by a planarization process, such as a CMP process. A conductive interconnect line 610 may then be formed over the planarized top surface of ILD 410 and contact 530, as illustrated in FIG. 6. For example, a metal, such as tungsten, copper or aluminum, may be deposited to form conductive line 610 that connects various features in semiconductor device 100, such as source region 220 and/or drain region 230 through contact 530 to an external electrode (not shown). Alternatively, conductive line 610 may connect various memory cells 210 in semiconductor device 100. Conductive line 610 may facilitate programming or erasing various memory cells 210 in semiconductor device 100.

Figure 7:
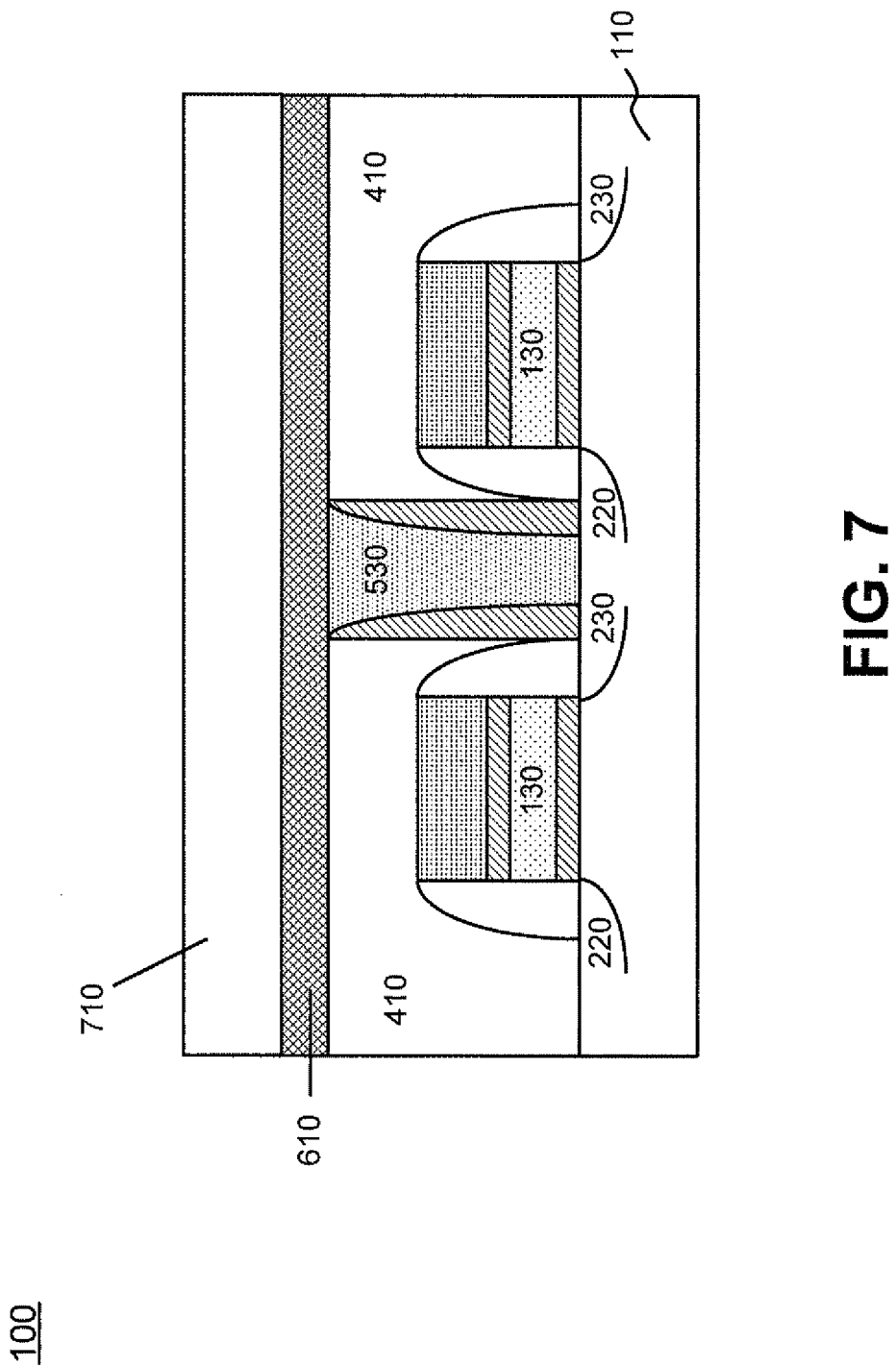
FIG. 7 is a cross-section illustrating the formation of an interlayer dielectric on the device of FIG. 6.

An ILD 710 may be formed over conductive line 610, as illustrated in FIG. 7. ILD 710, consistent with the invention, may include, for example, an oxide, a PSG, a BPSG material or another dielectric material. ILD 710 may have a thickness ranging from about 2,500 Å to about 3,500 Å.

Figure 8:
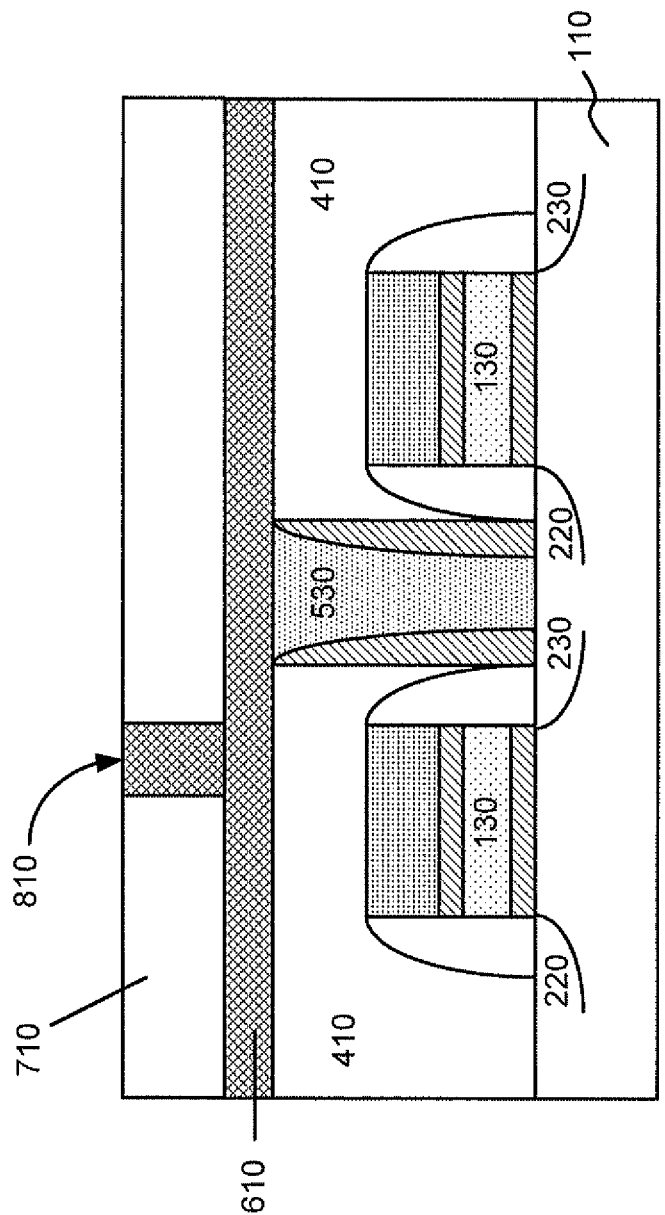
FIG. 8 is a cross-section illustrating the formation of a via in the interlayer dielectric of FIG. 7.

Various back end of line (BEOL) processing may be performed to complete the fabrication of semiconductor device 100. For example, a trench may be formed in ILD 710 followed by deposition of a metal layer, such as copper, aluminum or tungsten, to form via 810, as illustrated in FIG. 8. Via 810 may represent a connection to an uppermost conductive layer of semiconductor device 100. Alternatively, via 810 may represent a connection to any one of a number of conductive layers in semiconductor device 100.

Figure 9:
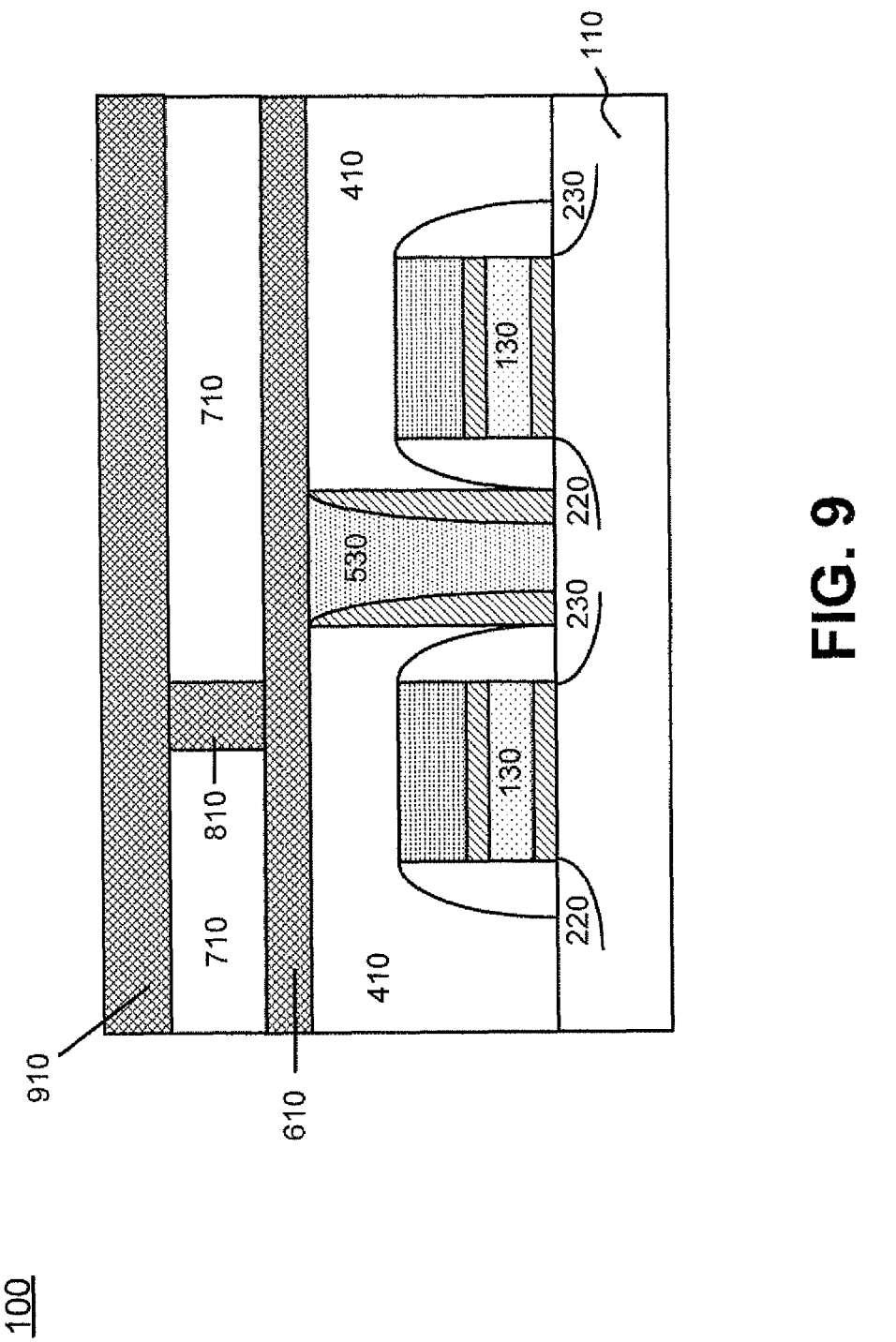
FIG. 9 is a cross-section illustrating the formation of a conductive layer on the device of FIG. 8.

A conductive layer may then be formed over ILD 710. For example, a metal, such as copper or aluminum, may be deposited to form conductive line 910, as illustrated in FIG. 9. Conductive line 910 may represent a BEOL structure or connector that connects various features in semiconductor device 100, such as source and/or drain regions 220/230 to an external electrode (not shown), to facilitate programming or erasing of various memory cells 210 in semiconductor device 100.

A top dielectric layer 1010, also referred to as cap layer 1010, may be formed over conductive line 910. In an exemplary embodiment, cap layer 1010 may be deposited to a thickness ranging from about 6,000 Å to about 10,000 Å. Cap layer 1010 may act as a protective layer to prevent damage to conductive line 910 and other portions of semiconductor device 100 during subsequent processing. For example, cap layer 1010 may protect semiconductor device 100 against impurity contamination during subsequent cleaning processes that may be used to complete a working memory device.

Figure 10:
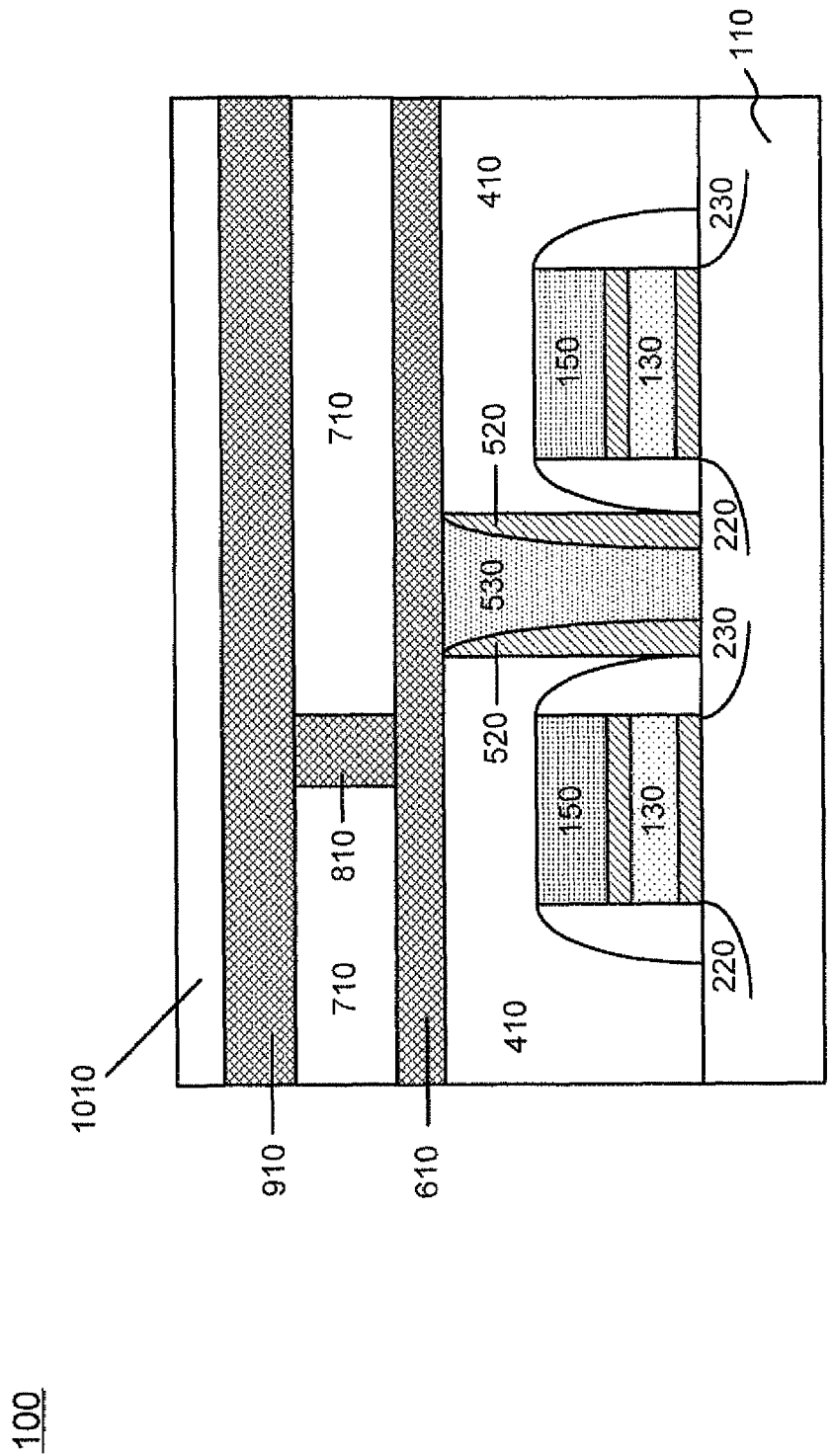
FIG. 10 is a cross-section illustrating the formation of a dielectric layer on the device of FIG. 9.

While only two ILDs (i.e., ILDs 410 and 710) and two conductive layers (i.e., layers 610 and 910) are illustrated in FIG. 10 for simplicity, it should be understood that semiconductor device 100 may include more ILD layers and conductive layers based on the particular circuit requirements.

As described above, in an exemplary embodiment, semiconductor device 100 illustrated in FIG. 10 may be a SONOS type memory device, with nitride layer 130 acting as a charge storage element for each memory cell 210. Each memory cell 210 may be an EEPROM type memory device and one or more programming circuits (not shown) may be used to facilitate programming and erasing of one or more memory cells 210 of semiconductor device 100. Programming of each memory cell 210 may be accomplished by applying a voltage to its control gate 150. Once programmed, electrons remain trapped in nitride layer 130 until an erase procedure is performed.

In an exemplary implementation consistent with the invention, each of memory cells 210 illustrated in FIG. 10 may be configured to store two or more bits of data. For example, charge storage layer 130 for each memory cell 210 may be programmed to store charges representing two separate bits of data by localizing the first and second charges to the respective left and right sides of charge storage layer 130 illustrated in FIG. 10. Each of the two bits of memory cell 210 may be programmed independently by, for example, channel hot electron injection, to store charges representing a bit on each respective side of the charge storage layer 130. In this manner, the charges in charge storage layer 130 become effectively trapped on each respective side of charge storage layer 130. Erasing of each bit in memory cell 210 may also be performed independently. During erasing, the charges stored in charge storage layer 130 may tunnel through dielectric layer 120 into the source region 220 and drain region 230, respectively. In alternative implementations, the charge storage layer 130 for each memory cell 210 may be configured to store charges representing three or more bits of data be localizing the charges in charge storage layer 130.

In this manner, the density of the array of memory cells 210 in semiconductor device 100 may be increased as compared to conventional memory devices that store only one bit of data per cell. In alternative implementations, each memory cell 210 may be configured to store a charge representing one bit of data per memory cell 210. In addition, in alternative implementations, semiconductor device 100 may be a floating gate memory device in which layer 130 is formed from a conductive material, such as polysilicon, that functions as a charge storage element for each memory cell 210.

In summary, implementations consistent with the invention form contacts with small device features, thereby reducing space requirements on a chip. Advantageously, the memory cells 210 of semiconductor device 100 exhibit improved resistance to charge leakage and, therefore, increased reliability. In addition, memory cells 210 exhibit improved data retention due to reduced charge gain and/or charge loss problems.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is also applicable to the formation of any of various other types of semiconductor devices in which high circuit density is important, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device, comprising:
   a substrate;
   a memory cell formed on the substrate, the memory cell comprising:
      a first dielectric layer formed on the substrate,
      a charge storage layer formed on the first dielectric layer,
      a second dielectric layer formed on the charge storage layer, and
      a control gate electrode formed on the second dielectric layer,
         the control gate electrode including polycrystalline silicon;
   a source region formed in the substrate;
   a drain region formed in the substrate;
   first spacers formed adjacent to the memory cell,
      each of the first spacers being formed on one of opposite sides of the memory cell,
      each of the first spacers including silicon oxynitride and substantially directly contacting the substrate,
      a top surface of each of the first spacers being substantially co-planar with a top surface of the control gate electrode;
   an interlayer dielectric layer formed over the memory cell and the first spacers,
      the interlayer dielectric layer including a boro-phosphosilicate glass (BPSG) material or a phosphosilicate glass (PSG) material and substantially contacting:
         the first spacers including the silicon oxynitride, and
         the top surface of the control gate electrode;
   a contact hole formed in the interlayer dielectric layer,
      a selected first spacer, of the first spacers, forming a portion of a wall defining the contact hole;
   a second spacer formed adjacent to the selected first spacer and on the wall defining the contact hole,
      a height of the second spacer being greater than a height of the first spacers,
      the second spacer substantially contacting the substrate and the interlayer dielectric layer,
      the first spacers and the second spacer being formed over the source region or the drain region; and
   a contact formed in the contact hole,
      the second spacer preventing charge leakage between:
         the contact, and
         the charge storage layer and the control gate electrode; and
   a conductive interconnect line formed over the interlayer dielectric layer and the contact.

2. The memory device of claim 1, where the second spacer includes a nitride,
   where a width of the second spacer ranges from about 50 Å to about 400 Å,
   where a width of the first spacer ranges from about 50 Å to about 400 Å,
   where a width of a portion of the contact ranges from about 400 Å to about 900 Å, and
   where the memory device further comprises:
      third spacers formed adjacent to another memory cell,
         each of the third spacers being formed on one of opposite sides of the other memory cell,
         the interlayer dielectric layer formed over the other memory cell and the third spacers,
         the contact hole being formed between the memory cell and the other memory cell;
      a fourth spacer formed on another wall, defining the contact hole, opposite the wall; and
      another interlayer dielectric layer formed over the conductive interconnect line.

3. The memory device of claim 1, where a width of each of the first spacers or the width of the second spacer is less than 300 Å.

4. The memory device of claim 1, where the second spacer comprises a nitride.

5. The memory device of claim 1, where the charge storage layer comprises silicon.

6. The memory device of claim 1, where the charge storage layer comprises polycrystalline silicon, and
   where the second dielectric layer comprises aluminum oxide or hafnium oxide.

7. The memory device of claim 1, where the charge storage layer is to store charges representing at least two bits of data for the memory cell.

8. A non-volatile memory device, comprising:
a plurality of memory cells formed on a substrate;
a source region formed in the substrate;
a drain region formed in the substrate;
first spacers formed adjacent, respectively, to the plurality of memory cells,
   each of the first spacers including silicon nitride and substantially contacting the substrate;
second spacers formed adjacent, respectively, to the plurality of memory cells,
   each of the second spacers being formed opposite a corresponding first spacer of the first spacers,
   each of the second spacers including silicon nitride and substantially contacting the substrate;
an interlayer dielectric layer formed over the plurality of memory cells, the first spacers, and the second spacers,
   the interlayer dielectric layer including a boro-phosphosilicate glass (BPSG) material or a phosphosilicate glass (PSG) material,
   the interlayer dielectric layer substantially contacting a top surface of a control gate electrode, including polycrystalline silicon, of each of the plurality of memory cells,
   a top surface of each of the first spacers and a top surface of a corresponding second spacer, of the second spacers, being substantially co-planar with the top surface of the control gate electrode of a corresponding memory cell of the plurality of memory cells;
a contact hole formed, in the interlayer dielectric layer, between two memory cells of the plurality of memory cells,
   one of the first spacers forming a portion of a wall defining the contact hole,
a third spacer formed adjacent to the one of the first spacers and on the wall defining the contact hole,
   a height of the third spacer being greater than a height of the one of the first spacers,
   each of the one of the first spacers and the third spacer being formed over the source region or the drain region, and
the interlayer dielectric layer contacting:
   a portion of the one of the first spacers, and
   a portion of the third spacer; and
a contact formed in the contact hole,
   the third spacer preventing charge leakage between the contact and at least one of the two memory cells.

9. The non-volatile memory device of claim 8, where a width of the one of the first spacers ranges from about 50 Å to about 400 Å,
where a width of the third spacer ranges from about 50 Å to about 400 Å,
where a width of a portion of the contact ranges from about 400 Å to about 900 Å, and
where the non-volatile memory device further comprises:
   a conductive interconnect line formed over and substantially contacting the interlayer dielectric layer and the contact;
   another interlayer dielectric layer formed over the conductive interconnect line;
   a metal layer deposited in a trench that is formed in the other interlayer dielectric layer; and
   a conductive layer formed over the other interlayer dielectric layer and the metal layer.

10. The non-volatile memory device of claim 8, where the third spacer comprises a nitride.

11. The non-volatile memory device of claim 8, where each of the plurality of memory cells includes a charge storage element to store charges representing two bits of information, and
where the third spacer prevents charge leakage between the contact and the charge storage element of the at least one of the two memory cells.

12. A memory device, comprising:
a plurality of memory cells formed on a substrate;
first spacers formed, respectively, on a first side surface of the plurality of memory cells and second spacers formed, respectively, on a second side opposite the first side surface of the plurality of memory cells,
   the first spacers and the second spacers including silicon nitride or silicon oxynitride, and
   the first spacers and the second spacers, formed on the plurality of memory cells, substantially contacting the substrate;
a dielectric layer formed over the plurality of memory cells, the first spacers, and the second spacers,
   the dielectric layer including a boro-phosphosilicate glass (BPSG) material or a phosphosilicate glass (PSG) material and substantially contacting:
      a top surface of a control gate electrode, including polycrystalline silicon, of each of the plurality of memory cells,
      the first spacers, and
      the second spacers,
   a top surface of each of the first spacers and a top surface of each of the second spacers being substantially co-planar with a top surface of the control gate electrode of a corresponding memory cell of the plurality of memory cells;
a plurality of contact holes formed in the dielectric layer between the plurality of memory cells,
   the first spacers or the second spacers forming portions of respective ones of a plurality of walls defining the plurality of contact holes;
third spacers formed:
   adjacent to the first spacers or the second spacers, and
   on the plurality of walls defining the plurality of contact holes,
   a height of each of the third spacers being greater than a height of each of the first spacers and a height of each of the second spacers,
   the third spacers including silicon nitride or silicon oxynitride; and
a plurality of contacts,
   each of the plurality of contacts being formed in a respective one of the plurality of contact holes,
   each of the third spacers being formed between:
      a respective one of the plurality of contacts, and
      the dielectric layer.

13. The memory device of claim 12, where each contact, of the plurality of contacts, substantially contacts a portion of a bit line coupled to a source region of one of the plurality of memory cells and a drain region of an adjacent one of the plurality of memory cells.

14. The memory device of claim 12, where the third spacers include dielectric spacers.

15. The memory device of claim 12, where a width of each of the first spacers and a width of each of the second spacers range from about 50 Å to about 400 Å,
where a width of each of the third spacers ranges from about 50 Å to about 400 Å, where a width of each of the plurality of contacts ranges from about 400 Å to about 900 Å, and where the memory device further comprises:
- a conductive interconnect line formed over and substantially in direct contact with the dielectric layer and the plurality of contacts;
- an interlayer dielectric layer formed over the conductive interconnect line;
- a metal layer deposited in a trench that is formed in the interlayer dielectric layer; and
- a conductive layer formed over the interlayer dielectric layer and the metal layer.

16. The memory device of claim 12, where each of the plurality of memory cells stores charges representing at least two bits of information, and
where each of the plurality of memory cells substantially contacts the substrate.

17. The memory device of claim 12, where each of the third spacers is formed to a height ranging from about 4000 Å to about 8000 Å.

18. The memory device of claim 15, where the interlayer dielectric layer includes a BPSG material or a PSG material.

19. The memory device of claim 6, further comprising:
- another interlayer dielectric layer formed over the conductive interconnect line,
  - the other interlayer dielectric layer including a BPSG material or a PSG material;
- a metal layer deposited in a trench that is formed in the other interlayer dielectric layer;
- a conductive layer formed over the other interlayer dielectric layer and the metal layer; and
- another dielectric layer formed over the conductive layer.

20. The non-volatile memory device of claim 9, where the other interlayer dielectric layer includes a BPSG material or a PSG material.

* * * * *

UNITED STATES PATENT AND TRADEMARK OFFICE
CERTIFICATE OF CORRECTION

| | | |
|---|---|---|
| PATENT NO. | : 8,564,041 B2 | Page 1 of 1 |
| APPLICATION NO. | : 11/551532 | |
| DATED | : October 22, 2013 | |
| INVENTOR(S) | : Angela T. Hui et al. | |

It is certified that error appears in the above-identified patent and that said Letters Patent is hereby corrected as shown below:

In the Specification

Please correct Column 1, Line 56 to read as follows:

memory cells is provided. Each of the memory cells includes

Signed and Sealed this
Eighteenth Day of February, 2014

Michelle K. Lee
*Deputy Director of the United States Patent and Trademark Office*